(12) United States Patent
Yao et al.

(10) Patent No.: US 8,089,732 B2
(45) Date of Patent: Jan. 3, 2012

(54) THIN FILM PIEZOELECTRIC ELEMENT AND ITS MANUFACTURING METHOD, HEAD GIMBAL ASSEMBLY AND DISK DRIVE UNIT WITH THE SAME

(75) Inventors: MingGao Yao, DongGuan (CN); Lin Guo, DongGuan (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 614 days.

(21) Appl. No.: 12/289,172

(22) Filed: Oct. 22, 2008

(65) Prior Publication Data

US 2009/0316306 A1    Dec. 24, 2009

(30) Foreign Application Priority Data

Jun. 23, 2008    (CN) .......................... 2008 1 0125022

(51) Int. Cl.
*G11B 5/48* (2006.01)
(52) U.S. Cl. ................................. 360/245.3; 360/294.4
(58) Field of Classification Search ............... 360/245.3, 360/294.4
See application file for complete search history.

(56) References Cited

U.S. PATENT DOCUMENTS 6,362,542 B1 *  3/2002  Novotny .................... 310/12.03
2001/0046107 A1 * 11/2001  Irie et al. .................... 360/294.4

* cited by examiner

*Primary Examiner* — Hoai V Ho
(74) *Attorney, Agent, or Firm* — Nixon & Vanderhye PC

(57) ABSTRACT

A thin film piezoelectric element includes a piezoelectric thin film layer, a seed layer and an elastic substrate layer. The piezoelectric thin film layer is a laminated structure comprising a first electrode layer, a second electrode layer and a piezoelectric layer sandwiched between the first electrode layer and the second electrode layer. The seed layer is formed on the second electrode layer, and the elastic substrate layer is formed on the seed layer. The thin film piezoelectric element is a single layer structure and has an elastic substrate layer for supporting the single layer structure, thereby it has enough stiffness and flexibility to afford facilities for manufacture and assembly and to avoid film peeling and deformation, ultimately increasing the production efficiency and lowering the cost. The invention also discloses a method for manufacturing the thin film piezoelectric element, a head gimal assembly and a disk drive unit with the same.

18 Claims, 13 Drawing Sheets

THIN FILM PIEZOELECTRIC ELEMENT AND ITS MANUFACTURING METHOD, HEAD GIMBAL ASSEMBLY AND DISK DRIVE UNIT WITH THE SAME

This application claims priority to Japanese Application No. 200810125022.5, filed Jun. 23, 2008, the entire contents of which are hereby incorporated by reference in this application.

FIELD OF THE INVENTION

The present invention relates to an information recording disk drive unit, and more particularly to a thin film piezoelectric element and its manufacture method, a head gimbal assembly and a disk drive unit with the same.

BACKGROUND OF THE INVENTION

One known type of information storage device is a disk drive device that uses magnetic media to store data and a movable read/write head that is positioned over the magnetic media to selectively read from or write to the rotating magnetic media, such as a magnetic disk.

Consumers are constantly desiring greater storage capacity for such disk drive devices, as well as faster and more accurate reading and writing operations. Thus disk drive manufacturers have continued to develop higher capacity disk drives by, for example, increasing the recording and reproducing density of the information tracks on the disks by using a narrower track width and/or a narrower track pitch. However, each increase in track density requires that the disk drive device have a corresponding increase in the positional control of the read/write head in order to enable quick and accurate reading and writing operations using the higher density disks. As track density increases, it becomes more and more difficult to quickly and accurately position the read/write head over the desired information tracks on the disk. Thus, disk drive manufacturers are constantly seeking ways to improve the positional control of the read/write head in order to take advantage of the continual increases in track density. One conventional approach is to employ a dual-stage actuator system.

FIG. 1a-1c is a conventional disk drive unit incorporating a dual-stage actuator system. The dual-stage actuator system includes a primary actuator such as a voice-coil motor 105 and a secondary micro-actuator such as a piezoelectric micro-actuator 107. A magnetic disk 101 of the disk drive unit is mounted on a spindle motor 102 for spinning the disk 101. A voice coil motor arm 104 carries a head gimbal assembly 106 that includes a slider 103 incorporating a read/write head, a piezoelectric micro-actuator 107 and a suspension 110 to support the slider 103 and the piezoelectric micro-actuator 107.

As the primary actuator, the voice-coil motor 105 is provided for controlling the motion of the motor arm 104 and, in turn, controlling the slider 103 to move from track to track across the surface of the disk 101, thereby enabling the read/write head to read data from or write data to the disk 101. According to the voice-coil motor 105, the piezoelectric micro-actuator 107 corrects the placement on a much small scale to compensate the vibration tolerance of the suspension 110 or the voice-coil micro-actuator 105. Thereby, the piezoelectric micro-actuator 107 enables a smaller recordable track width, and increases the tracks per inch (TPI), also, it reduces traces accessing time and positioning time. Thus, the introduction of the piezoelectric micro-actuator increases the trace density of the disk drive unit greatly.

FIG. 1b illustrates a head gimbal assembly 106 of the conventional disk drive unit with a dual-stage actuator shown in FIG. 1a. As illustrated, the suspension 110 of the head gimbal assembly 106 includes a flexure 111 with a plurality of traces, a slider support portion 112 with a bump 112a, a metal base plate 113 and a load beam 114 with a dimple 114a to support the slider support portion 112 and the metal base plate 113. The flexure 111 connects the slider support portion 112 and the metal base plate 113 by the traces thereon, the tongue region of the flexure 111 has a slider mounting region 111b for mounting the slider thereon and a piezoelectric element mounting region 111a for mounting the piezoelectric element of the piezoelectric micro-actuator 107 thereon, the slider 103 is partially mounted on the slider support portion 112 through the slider mounting region 111b. The slider support portion 112 forms a bump 112a thereon to support the center of the backside of the slider 103 and the dimple 114a of the load beam 114 sustains the bump 112a, in doing this, enabling the bump 112a to keep the load force from the load beam 114 always evenly applying to the center of the slider 103 when the slider 103 flying on the disk. The piezoelectric micro-actuator 107 includes a left thin film piezoelectric element 201 and a right thin film piezoelectric element 202 connecting with the left thin film piezoelectric element 201, the left thin film piezoelectric element 201 and the right thin film piezoelectric element 202 adhere to the piezoelectric element mounting region 111a of the flexure 111. Referring to FIG. 1c also, when a voltage is input to the two thin film piezoelectric element 201,202, one thin film piezoelectric element 201/202 thereof will contract and the other thin film piezoelectric element 202/201 thereof will expand, this will generate a rotation torque to the slider support portion 112, thus the slider support portion 112 and the slider 103 will rotate against the dimple 114a subsequently, to achieve a slider fine position adjustment.

FIG. 2 is a plan view of a conventional piezoelectric micro-actuator shown in FIG., FIG. 2a is cross-sectional view taken along line A-A of FIG. 2, and FIG. 2b is cross-sectional view taken along line B-B of FIG. 2. As is shown, a pair of electrode pads 204 are formed on the left thin film piezoelectric element 202 and a pair of electrode pads 206 are formed on the right thin film piezoelectric element 201. The right thin film piezoelectric element 201 and the left thin film piezoelectric (PZT) element 202 are coated and covered by a polymer 209, the polymer 209 includes a connection portion 911 at the place between the right and the left thin film piezoelectric (PZT) element 201, 202 to connect them physically. The right and the left thin film piezoelectric (PZT) element 201, 202 are laminated structures, and respectively include a first piezoelectric thin film layer 22 and a second piezoelectric thin film layer 25, and the two thin film layers 22, 25 are laminated together by adhesive 28. Specifically, the first piezoelectric thin film layer 22 includes a first electrode layer 223, a second electrode layer 224 and a first piezoelectric layer 222 sandwiched between the first electrode layer 223 and the second electrode layer 224, the second thin film layers 25 includes a third electrode layer 256, a fourth electrode layer 257 and a second piezoelectric layer 225 sandwiched between the third electrode layer 256 and the fourth electrode layer 257, the adhesive 28 is coated between the second electrode layer 224 and the third electrode layer 256 to bond the first and the second piezoelectric thin film layer 22, 25 together.

FIGS. 3a-3d show a conventional method of manufacturing the thin film piezoelectric element. Firstly, as shown in FIG. 3a, laminating a first electrode layer 223, a first piezoelectric layer 222 and a second electrode layer 224 on a substrate 11 in succession to form a first piezoelectric thin film layer 22, and laminating a fourth electrode layer 257, a second piezoelectric layer 225 and a third electrode layer 256 on a substrate 12 in succession to form a second piezoelectric thin film layer 25. Further referring to FIG. 3b, bonding the two piezoelectric thin film layers 22, 25 with the substrate 11, 12 respectively thereon together by an adhesive 28. Then, as shown in FIG. 3c, removing the substrate 11 by chemical etching or other similar technique. Finally, as shown in FIG. 3d, removing the second substrate 12 to form the thin film piezoelectric element.

However, due to the process limitation, especially the chemical etching accuracy control limitation, the process yield for the above-mentioned thin film piezoelectric element is very low. Moreover, since there are two piezoelectric thin film layer are bonded together by an adhesive, the process is very complex and expensive, and it is easy to cause the piezoelectric thin film peeling. In addition, there are two substrate-removing processes in the process, which may cause a high reject rate and in turn, increase the manufacture cost.

Hence, in order to lower cost and eliminate the adhesive process to increase the process yield, a design of a piezoelectric element having only a single piezoelectric thin film layer is put forward, however, the stiffness and flexibility of a single piezoelectric thin film layer is too weak to operate and it is easy to be damaged during its manufacturing and assembly process, thus it still can not increase the production efficiency and the rate of finished products.

Thus, it is desired to provide an improved thin film piezoelectric element and its manufacturing method to overcome the above-mentioned drawbacks.

SUMMARY OF THE INVENTION

One objective of the invention is to provide a thin film piezoelectric element, which has a single piezoelectric thin film layer structure and an elastic substrate layer for supporting the piezoelectric thin film layer, thereby it has enough stiffness and flexibility to afford facilities for its manufacture and assembly process, also, eliminates the adhesive process to avoid the thin film peeling and deformation, ultimately increasing the production efficiency and lowering the cost.

Another objective of the invention is to provide a method for manufacturing a thin film piezoelectric element, which produces a thin film piezoelectric element having a single piezoelectric thin film layer structure and an elastic substrate layer for supporting the piezoelectric thin film layer, thereby the thin film piezoelectric element has enough stiffness and flexibility to afford facilities for its manufacture and assembly process, also, eliminates the adhesive process to avoid the thin film peeling and deformation, ultimately increasing the production efficiency and lowering the cost.

Another objective of the invention is to provide a head gimbal assembly (HGA), which has a thin film piezoelectric element having a single piezoelectric thin film layer structure and an elastic substrate layer for supporting the piezoelectric thin film layer, thereby the thin film piezoelectric element has enough stiffness and flexibility to afford facilities for its manufacture and assembly process, also, eliminates the adhesive process to avoid the thin film peeling and deformation, ultimately increasing the efficiency production and lowering the cost.

A further objective of the invention is to provide a disk drive unit, which has a head gimbal assembly with a thin film piezoelectric element having a single piezoelectric thin film layer structure and an elastic substrate layer for supporting the piezoelectric thin film layer, thereby the thin film piezoelectric element has enough stiffness and flexibility to afford facilities for its manufacture and assembly process, also, eliminates the adhesive process to avoid the thin film peeling and deformation, ultimately increasing the production efficiency and lowering the cost.

To achieve the above objectives, a thin film piezoelectric element comprises a piezoelectric thin film layer, a seed layer and an elastic substrate layer, the piezoelectric thin film layer is a laminated structure and comprises a first electrode layer, a second electrode layer and a piezoelectric layer sandwiched between the first electrode layer and the second electrode layer. The seed layer is formed on the second electrode layer, and the elastic substrate layer is formed on the seed layer.

In one embodiment of the thin film piezoelectric element according to the present invention, the invention further comprises a seed layer sandwiched between any two adjacent layers among the first electrode layer, the piezoelectric layer and the second electrode layer and/or further comprises a seed layer is formed on the electrode layer.

In another embodiment of the thin film piezoelectric element according to the present invention, the material of the elastic substrate layer is epoxy material or polymer material. The material of the seed layer is metal or metal oxide, preferably, it is SiO or Ti, and the seed layer is 10-200 angstrom in thickness.

A method for manufacturing a thin film piezoelectric element comprises steps of: (1) forming a piezoelectric thin film layer by laminating a first electrode layer, a piezoelectric layer and a second electrode layer together, wherein the piezoelectric layer is sandwiched between the first electrode layer and the second electrode layer; (2) forming a seed layer on the second electrode layer; and (3) forming an elastic substrate layer on the seed layer.

A head gimbal assembly of a disk drive unit comprises a suspension and a thin film piezoelectric element, the suspension comprises a flexure having a piezoelectric element mounting region thereon, the thin film piezoelectric element comprises a piezoelectric thin film layer, a seed layer and an elastic substrate layer, the piezoelectric thin film layer being a laminated structure comprises a first electrode layer, a second electrode layer and a piezoelectric layer sandwiched between the first electrode layer and the second electrode layer, the seed layer is formed on the second electrode layer and the elastic substrate layer is formed on the seed layer. The first and the second electrode layer respectively have a plurality of electrode pads extending outwards therefrom, the thin film piezoelectric element is mounted onto the flexure by cling the elastic substrate layer to the piezoelectric element mounting region and electrically connecting the electrode pads to the flexure.

A disk drive unit comprises a disk, a spindle motor to spin the disk, a drive arm and a head gimbal assembly mounted on the drive arm, the head gimbal assembly of a disk drive unit comprises a suspension and a thin film piezoelectric element, the suspension comprises a flexure having a piezoelectric element mounting region thereon, the thin film piezoelectric element comprises a piezoelectric thin film layer, a seed layer and an elastic substrate layer, the piezoelectric thin film layer being a laminated structure comprises a first electrode layer, a second electrode layer and a piezoelectric layer sandwiched between the first electrode layer and the second electrode layer, the seed layer is formed on the second electrode layer and the elastic substrate layer is formed on the seed layer. The first and the second electrode layer respectively have a plurality of electrode pads extending outwards therefrom, the thin film piezoelectric element is mounted onto the flexure by cling the elastic substrate layer to the piezoelectric element mounting region and electrically connecting the electrode pads to the flexure.

Compared with the prior art, because the thin film piezoelectric element only has a single piezoelectric thin film layer, thus it does not need to bond two single piezoelectric thin film layers together by adhesive and, accordingly simplifies its manufacturing process and avoids the film peeling effectively. In addition, since the seed layer is formed on the second electrode layer of the piezoelectric thin film layer, the elastic substrate layer is enabled to be formed on the seed layer for supporting the piezoelectric thin film layer, thus increasing the stiffness and flexibility of the thin film piezoelectric element, avoiding the inconvenience in manufacturing and assembly process due to inadequate stiffness and flexibility of a single laminated piezoelectric structure, and having no adverse impact on the extension-contraction deformation of the piezoelectric thin film layer. Further, the introduction of the seed layer, on the one hand, enables layers of the thin film piezoelectric element to connect each other more steadily, thus ensuring the layers not too easy to separate each other to prevent the thin film from peeling, on the other hand, the seed layer is also able to increase the stiffness and flexibility of the thin film piezoelectric element benefiting to its manufacturing and assembly process.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 1b is an exploded, perspective view of a conventional head gimbal assembly unit with a thin film piezoelectric micro-actuator of the drive disk shown in FIG. 1a;

DETAILED DESCRIPTION OF THE INVENTION

Figure 1A:
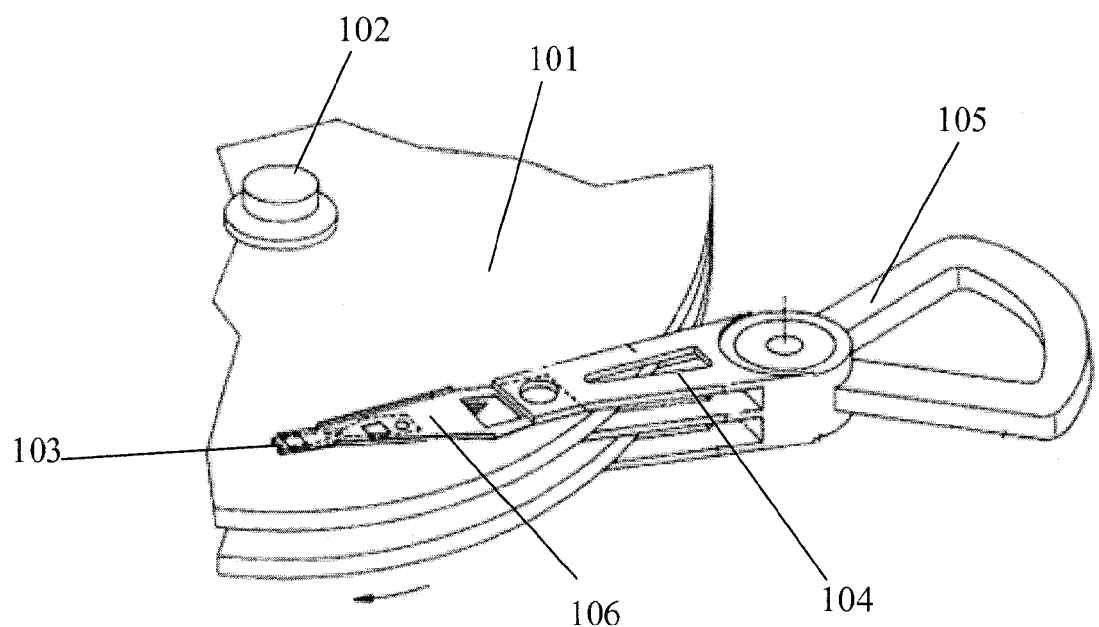
FIG. 1a is a perspective view of a conventional disk drive device.
Figure 1B:
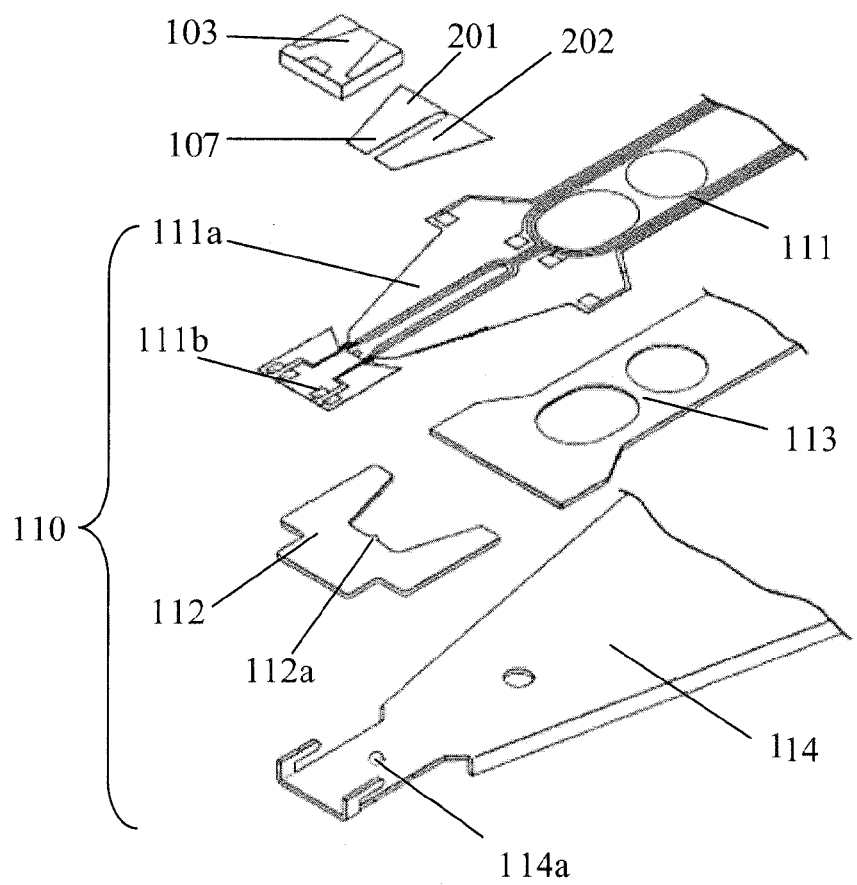
Figure 1C:
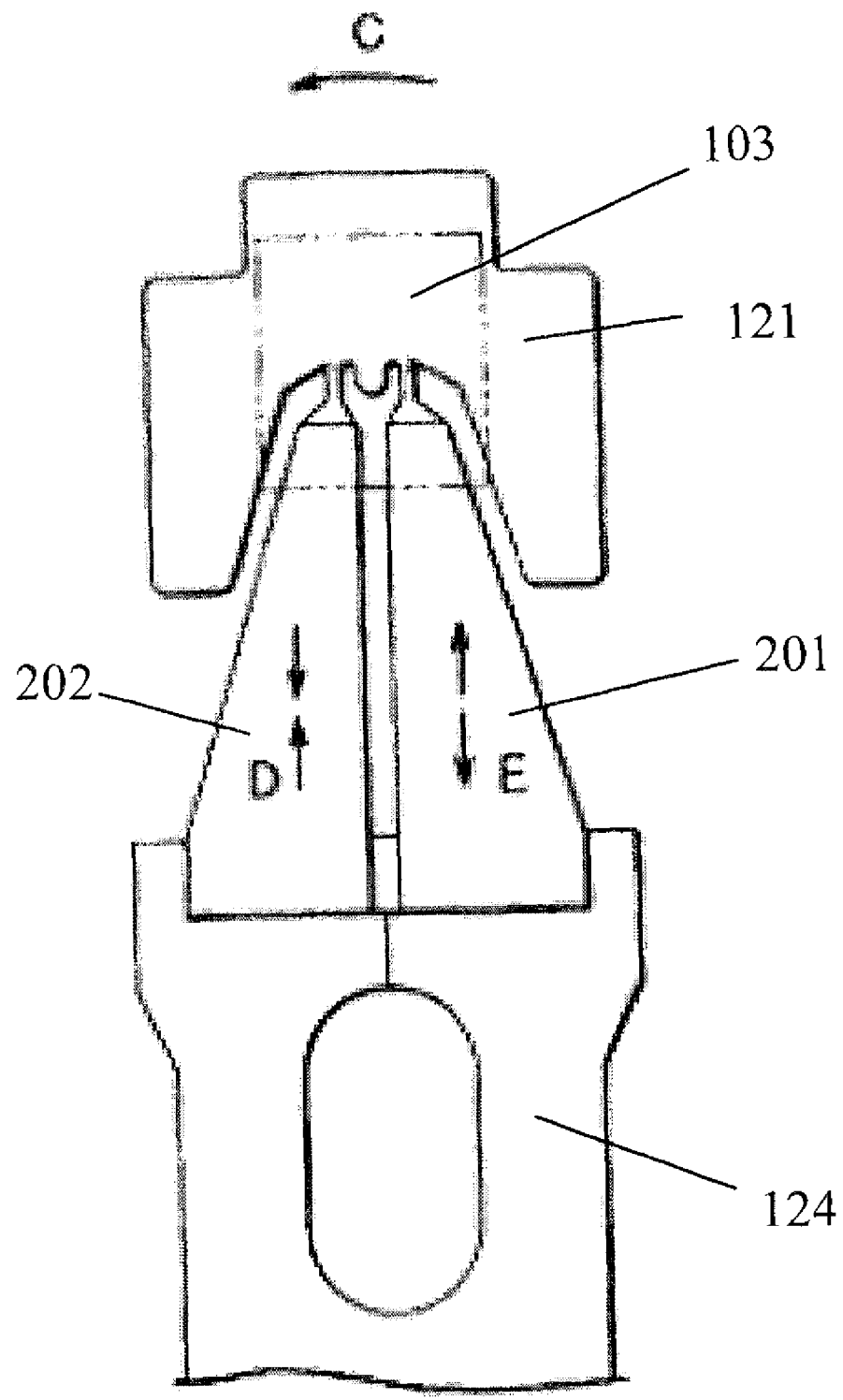
FIG. 1c is a schematic view illustrating contracting and expanding of the two thin film piezoelectric elements of the thin film piezoelectric micro-actuator of the head gimbal assembly shown in FIG. 1b.
Figure 2:
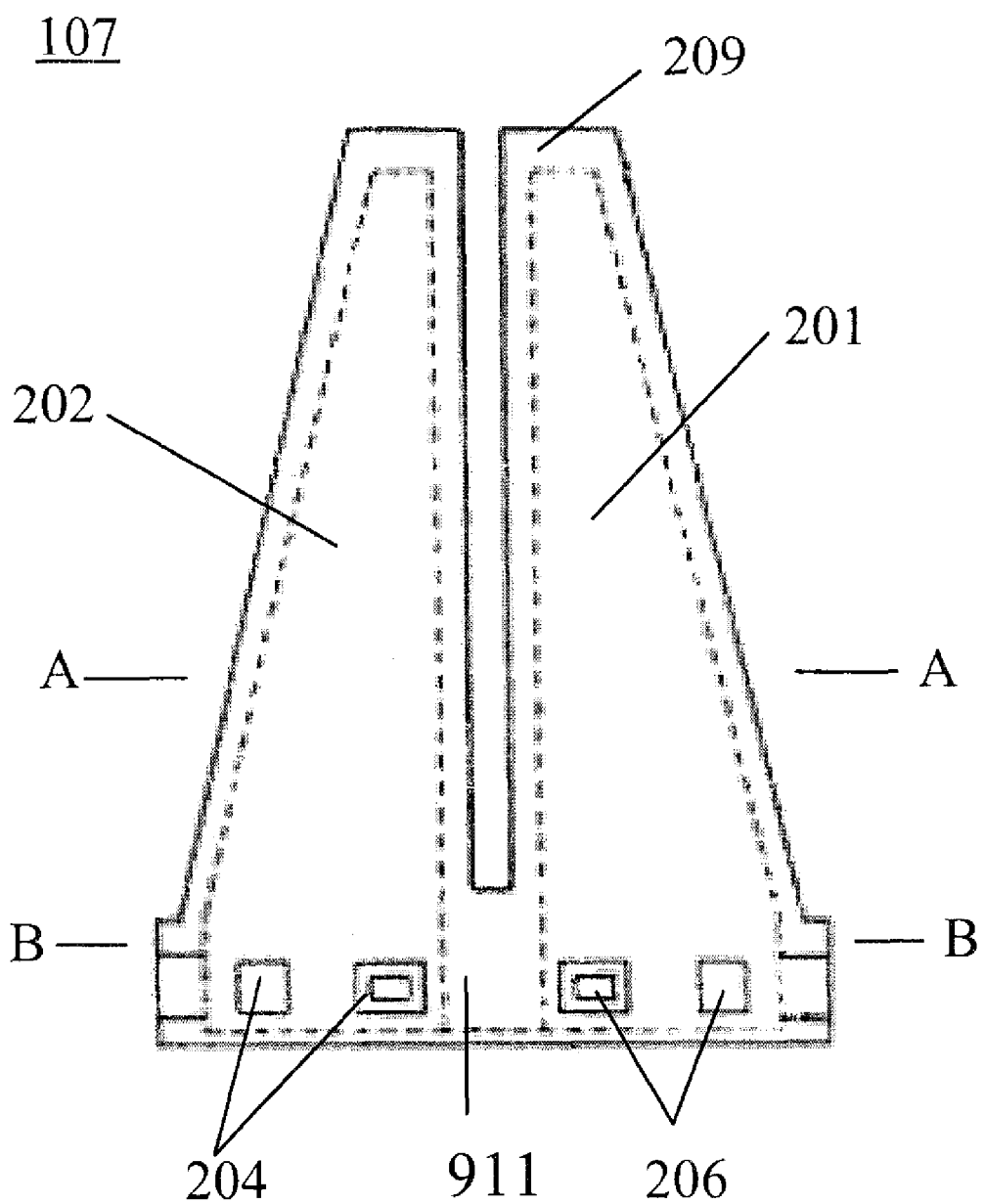
FIG. 2 is a plan view of a conventional thin film piezoelectric micro-actuator.
Figure 2A:
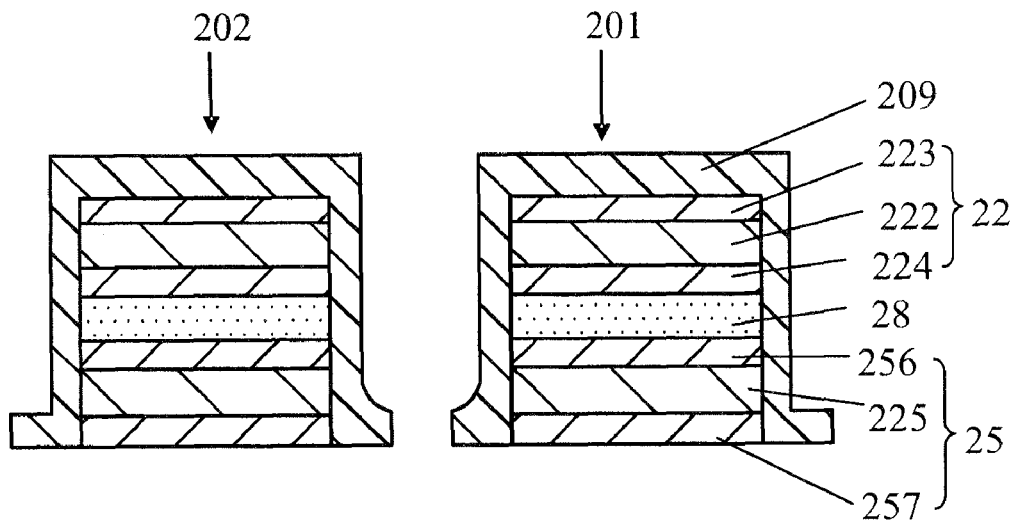
FIG. 2a is a cross-sectional view of FIG. 2 taken along line A-A.
Figure 2B:
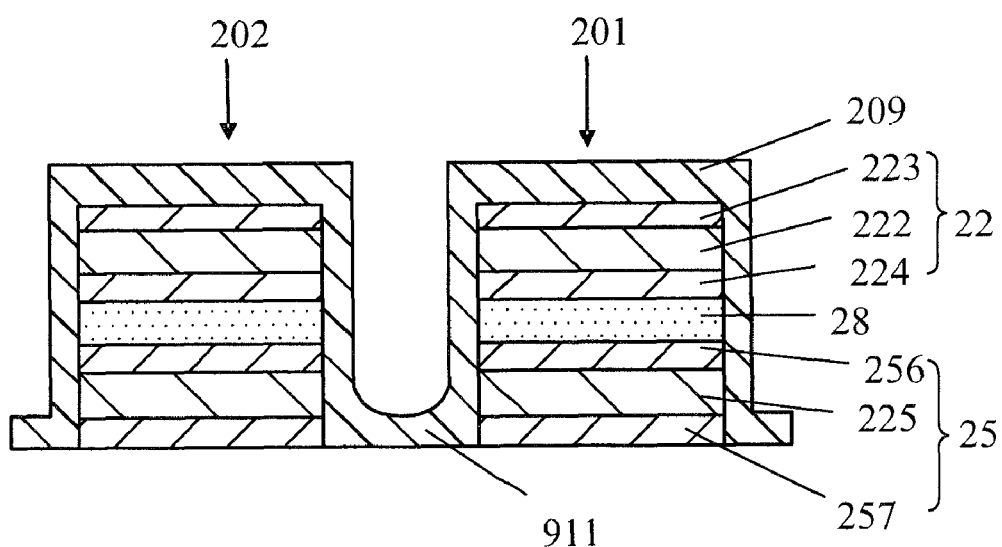
FIG. 2b is a cross-sectional view of FIG. 2 taken along line B-B.
Figures 3A, 3B, 3C, 3D:
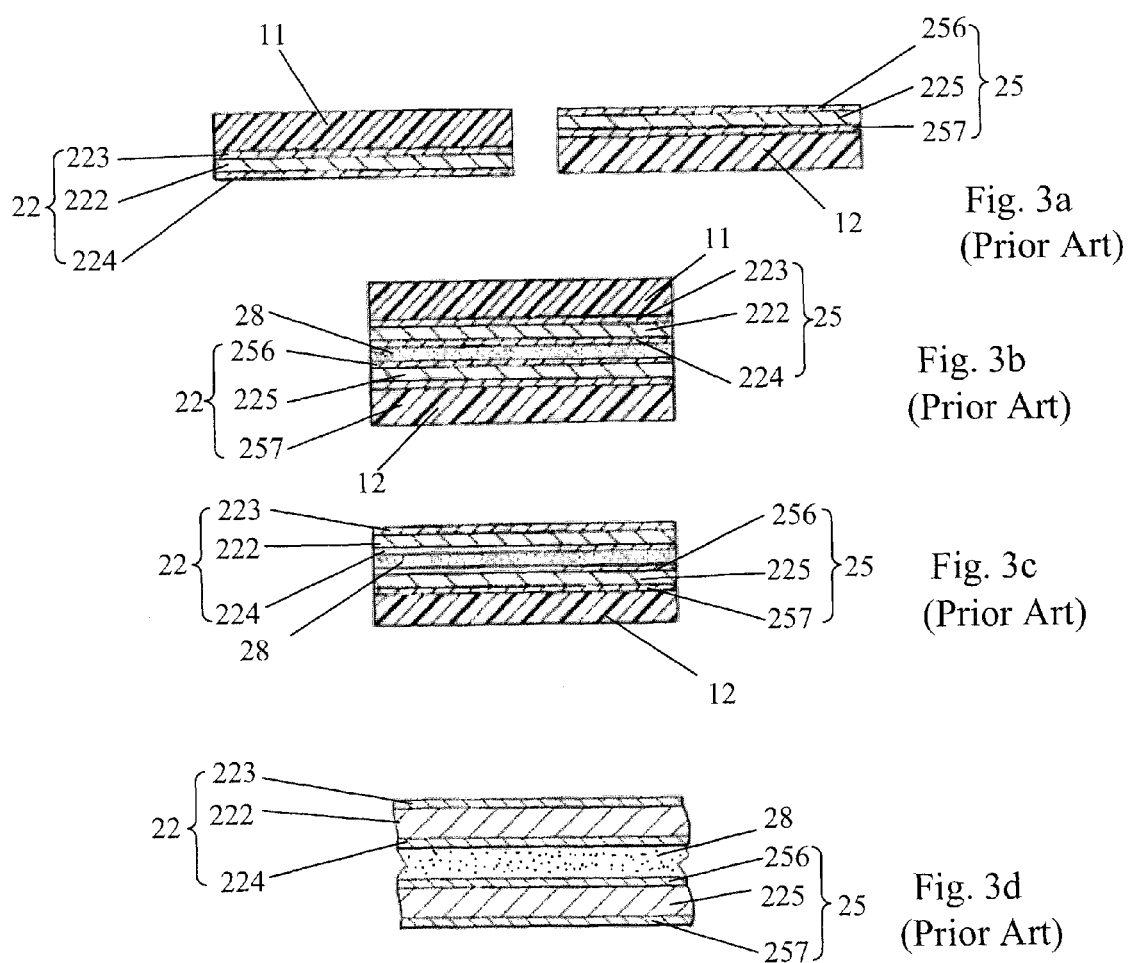
FIG. 3a-3d are sequential views illustrating a manufacturing process of a conventional thin film piezoelectric micro-actuator shown in FIG. 2.

Various preferred embodiments of the invention will now be described with reference to the Figures, wherein like reference numerals designate similar parts throughout the various views.

Figure 4:
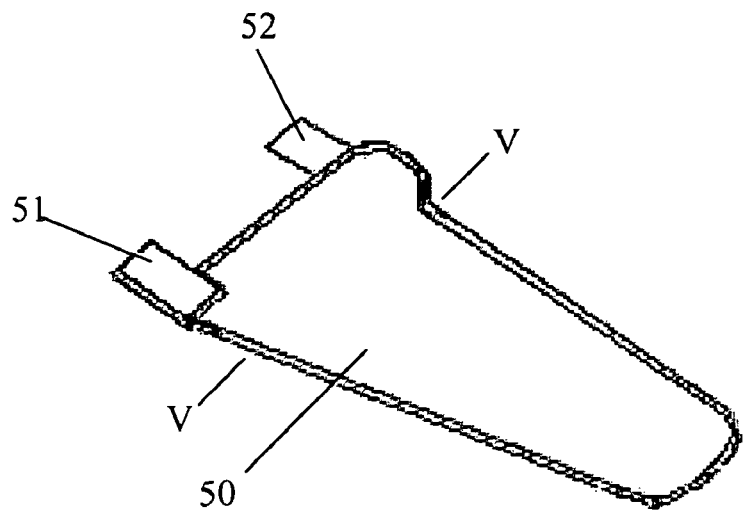
FIG. 4 a perspective view of a thin film piezoelectric element according to a first embodiment of the invention.
Figure 5:
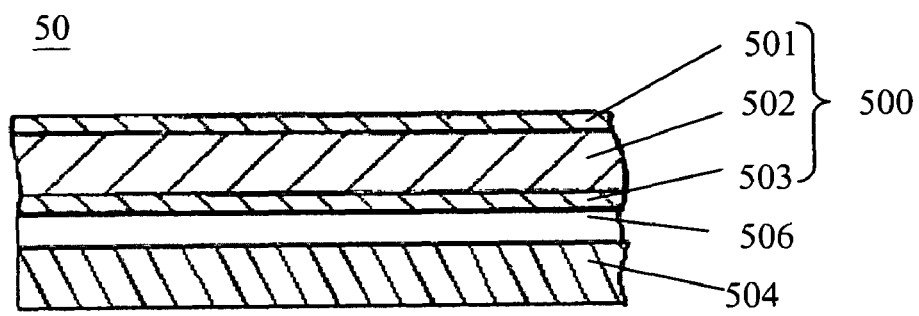
FIG. 5 is a cross-sectional view of FIG. 4 taken along line V-V.
Figure 6:
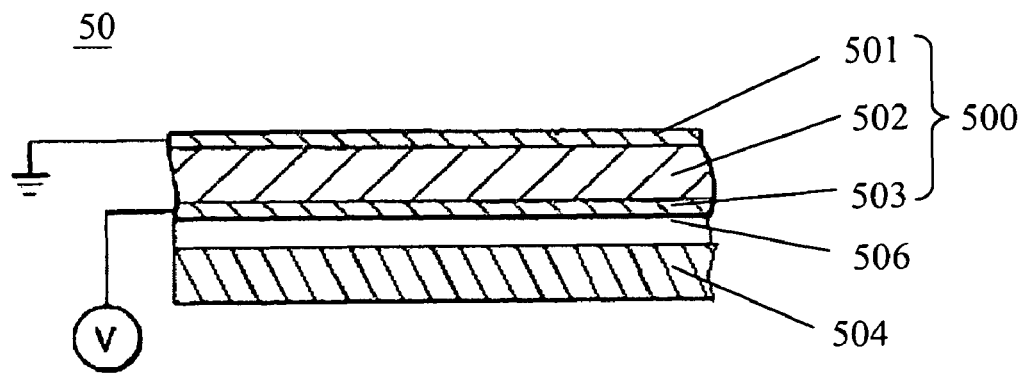
FIG. 6 is a schematic view illustrating the circuit connection of the thin film piezoelectric element according to the first embodiment of the invention shown in FIG. 4.
Figure 7A:
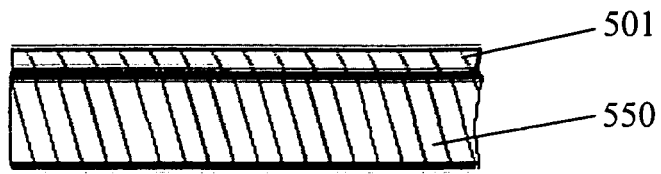
FIGS. 7a-7f are sequential views illustrating a manufacturing process of the thin film piezoelectric element according to the first embodiment of the invention shown in FIG. 4.
Figure 7B:
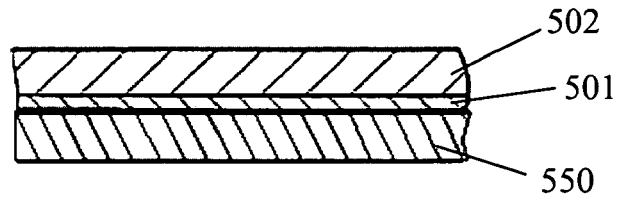
Figure 7C:
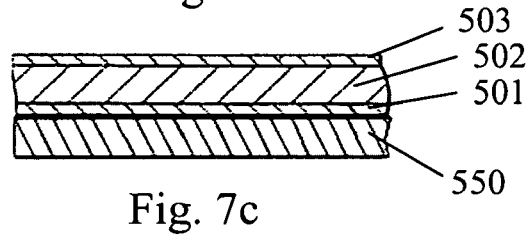
Figure 7D:
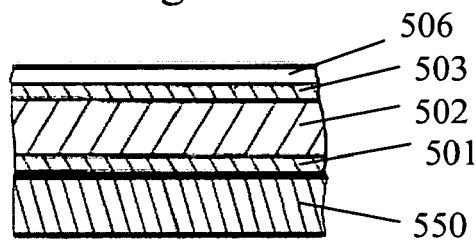
Figure 7E:
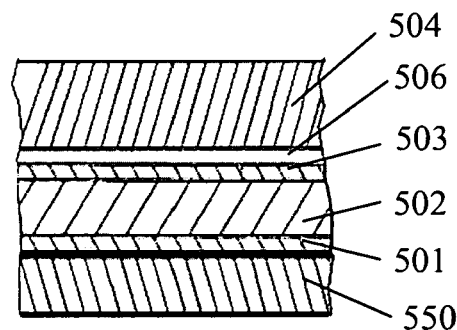
Figure 7F:
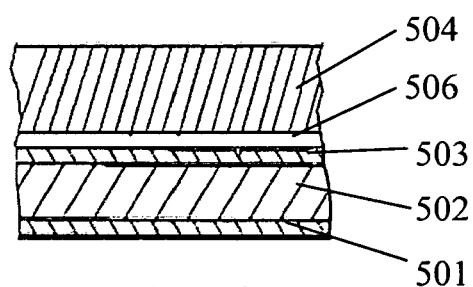

Referring to FIGS. 4-6, a thin film piezoelectric element 50 according to a first embodiment of the invention comprises a piezoelectric thin film layer 500, a seed layer 506 and an elastic substrate layer 504. The piezoelectric thin film layer 500 is a laminated structure and comprises a first electrode layer 501, a second electrode layer 503 and a piezoelectric layer 502 sandwiched between the first electrode layer 501 and the second electrode layer 503. The seed layer 506 is formed on the second electrode layer 503 and the elastic substrate layer 504 is formed on the seed layer 506. The first and the second electrode layers 501, 503 respectively have two electrode pads 51, 52 extending outwards therefrom, and the electrode pads 51, 52 electrically connect with the outside. The material of the elastic substrate layer 504 is epoxy material or polymer material, and the elastic substrate layer is used for supporting the piezoelectric thin film layer 500, thus increasing the stiffness and flexibility of the thin film piezoelectric element 50, and avoiding the inconvenience in manufacturing and assembly process due to inadequate stiffness and flexibility of a single laminated piezoelectric structure and having no adverse impact on the extension-contraction deformation of the piezoelectric thin film layer 500. The material of the seed layer 506 is metal and metal oxide, such as SiO or Ti, and the seed layer is 10-200 angstrom in thickness. On the one hand, the seed layer 506 enables the piezoelectric thin film layer 500 and the elastic substrate layer 504 to connect each other more steadily, thus to prevent them from peeling, on the other hand, the seed layer 506 is also able to increase the stiffness and flexibility of the thin film piezoelectric element 50 benefiting to its manufacturing and assembly process.

FIGS. 7a-7f illustrate the manufacturing process of the thin film piezoelectric element 50 according to a first embodiment of the invention. The method for manufacturing the thin film piezoelectric element 50 comprises steps of: (1) providing a wafer substrate 550, and forming the first electrode layer 501 on the wafer substrate (shown in FIG. 7a); (2) forming the piezoelectric layer 502 on the first electrode layer 501 (shown in FIG. 7b); (3) forming the second electrode layer 503 on the piezoelectric layer 502 (shown in FIG. 7c); (4) forming the seed layer 506 on the second electrode layer 503, wherein the material of the seed layer 506 is metal or metal oxide, such as SiO or Ti, and it is 10-200 angstrom in thickness (shown in FIG. 7d); (5) forming the elastic substrate layer 504 on the seed layer 506, wherein the material of the elastic substrate layer 504 is epoxy material or polymer material (shown in FIG. 7e); and (5) removing the wafer substrate 550 by chemical etching to get the thin film piezoelectric element 50.

As the thin film piezoelectric element 50 only has a single piezoelectric thin film layer, thus it does not need to bond two single piezoelectric thin film layers together by adhesive and, accordingly simplifies its manufacturing process and avoids the film peeling effectively, ultimately increases the production efficiency and lowers the cost.

Figure 8:
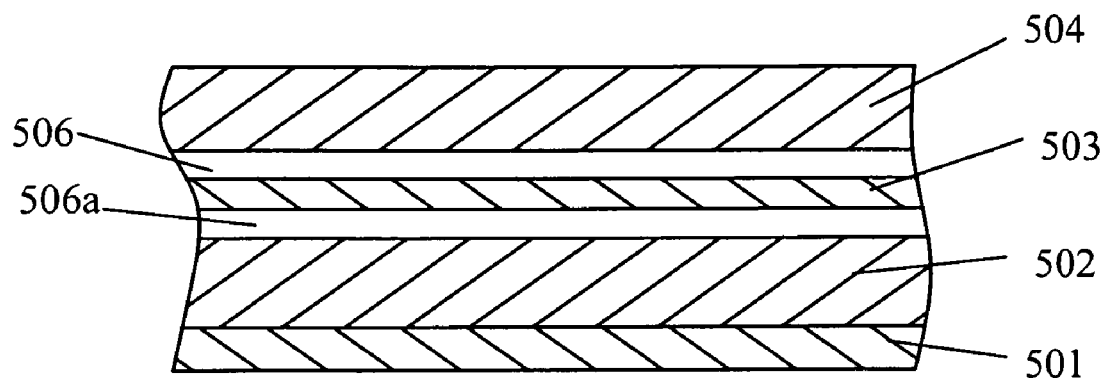
FIG. 8 shows a cross-sectional view of a thin film piezoelectric element according to a second embodiment of the invention.

FIG. 8 is a cross-sectional view of a thin film piezoelectric element 50a according to a second embodiment of the invention. As is shown, compared with the thin film piezoelectric element 50 according to the first embodiment of the invention, the thin film piezoelectric element 50a still sandwiches an additional seed layer 506a between the piezoelectric layer 502 and the second electrode layer 503, the material of the seed layer 506a is metal and metal oxide, such as SiO or Ti, and the seed layer is 10-200 angstrom in thickness. On the one hand, the seed layer 506a enables the piezoelectric layer 502 and the second electrode layer 503 to connect with each other more steadily, thus to prevent them from peeling, on the other hand, the seed layer 506a is also able to increase the stiffness and flexibility of the thin film piezoelectric element 50a benefiting to its manufacturing and assembly process. As structure, function and material of the other parts of the thin film piezoelectric element 50a are similar to the thin piezoelectric element 50 according to the first embodiment of the invention, a detailed description of which is omitted herefrom.

Figure 9:
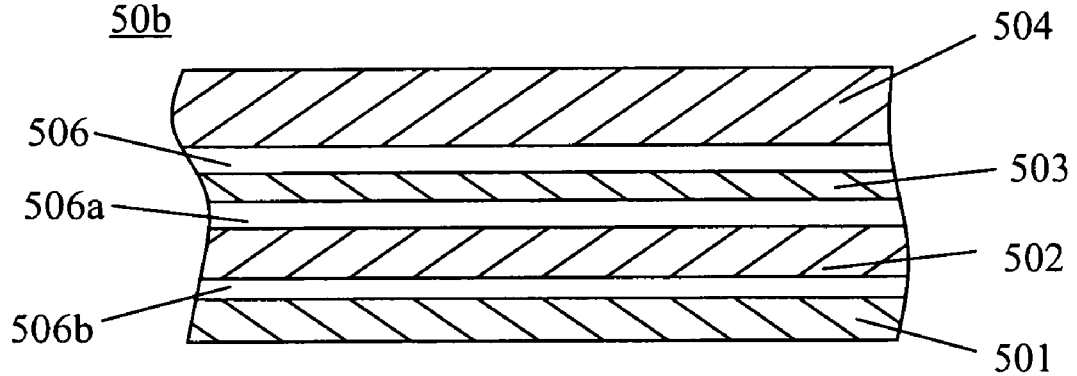
FIG. 9 shows a cross-sectional view of a thin film piezoelectric element according to a third embodiment of the invention.

FIG. 9 is a cross-sectional view of a thin film piezoelectric element 50b according to a third embodiment of the invention. As is shown, compared with the thin film piezoelectric element 50a according to the second embodiment of the invention, the thin film piezoelectric element 50b still sandwiches an additional seed layer 506b between the piezoelectric layer 502 and the first electrode layer 501, the material of the seed layer 506b is metal and metal oxide, such as SiO or Ti, and the seed layer is 10-200 angstrom in thickness. On the one hand, the seed layer 506b enables the piezoelectric layer 502 and the first electrode layer 501 to connect with each other more steadily, thus to prevent them from peeling, on the other hand, the seed layer 506b is also able to increase the stiffness and flexibility of the thin film piezoelectric element 50b benefiting to its manufacturing and assembly process. As structure, function and material of the other parts of the thin film piezoelectric element 50b are similar to the thin piezoelectric element 50a according to the second embodiment of the invention, a detailed description of which is omitted herefrom.

Figure 10:
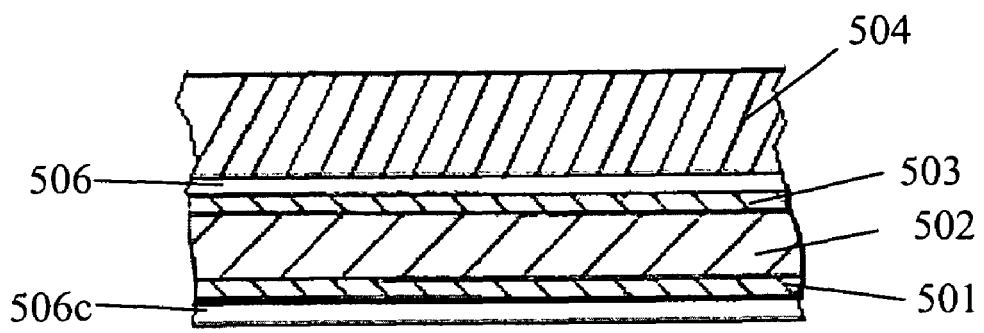
FIG. 10 shows a cross-sectional view of a thin film piezoelectric element according to a fourth embodiment of the invention.

FIG. 10 is a cross-sectional view of a thin film piezoelectric element 50c according to a fourth embodiment of the invention. As is shown, compared with the thin film piezoelectric element 50 according to the first embodiment of the invention, the thin film piezoelectric element 50c still forms an additional seed layer 506c on the first electrode layer 501, the material of the seed layer 506c is metal and metal oxide, such as SiO or Ti, and the seed layer is 10-200 angstrom in thickness. The seed layer 506c is able to increase the stiffness and flexibility of the thin film piezoelectric element 50c benefiting to its manufacturing and assembly process. As structure, function and material of the other parts of the thin film piezoelectric element 50c are similar to the thin piezoelectric element 50 according to the first embodiment of the invention, a detailed description of which is omitted herefrom.

Figure 11:
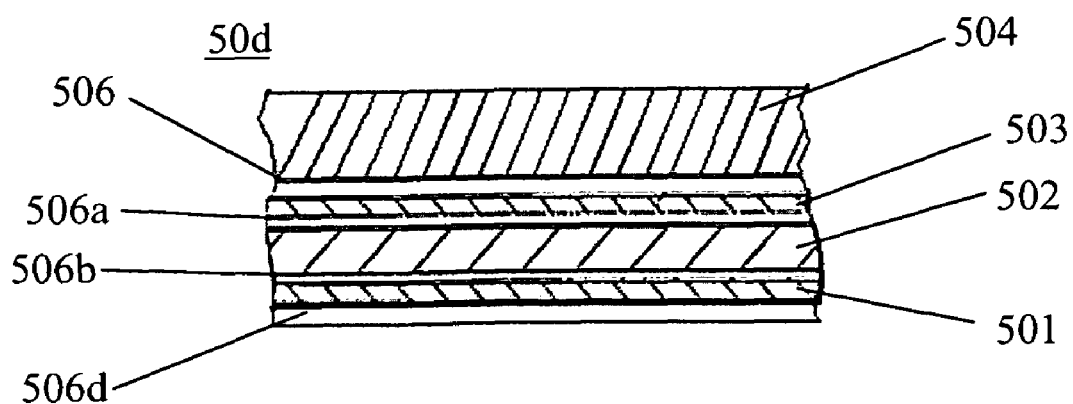
FIG. 11 shows a cross-sectional view of a thin film piezoelectric element according to a fifth embodiment of the invention.

FIG. 11 is a cross-sectional view of a thin film piezoelectric element 50d according to a fifth embodiment of the invention. As is shown, compared with the thin film piezoelectric element 50b according to the third embodiment of the invention, the thin film piezoelectric element 50d still forms an additional seed layer 506d on the first electrode layer 501, the material of the seed layer 506d is metal and metal oxide, such as SiO or Ti, and the seed layer is 10-200 angstrom in thickness. The seed layer 506d is able to increase the stiffness and flexibility of the thin film piezoelectric element 50d benefiting to its manufacturing and assembly process. As structure, function and material of the other parts of the thin film piezoelectric element 50d are similar to the thin piezoelectric element 50b according to the third embodiment of the invention, a detailed description of which is omitted herefrom.

Of course, besides the thin film piezoelectric elements 50a, 50b, 50c, 50d according to the first, second, third, fourth and fifth embodiments of the invention, the thin film piezoelectric element of the invention can further form a seed layer sandwiched between any two adjacent layers among the first electrode layer 501, the piezoelectric layer 502 and the second electrode layer 503 and/or further forms a seed layer on the first electrode layer 501.

As the manufacturing methods of the thin film piezoelectric elements 50a, 50b, 50c 50d are the same as the thin film piezoelectric element 50, detailed illustrations of which are omitted herefrom.

Figure 12:
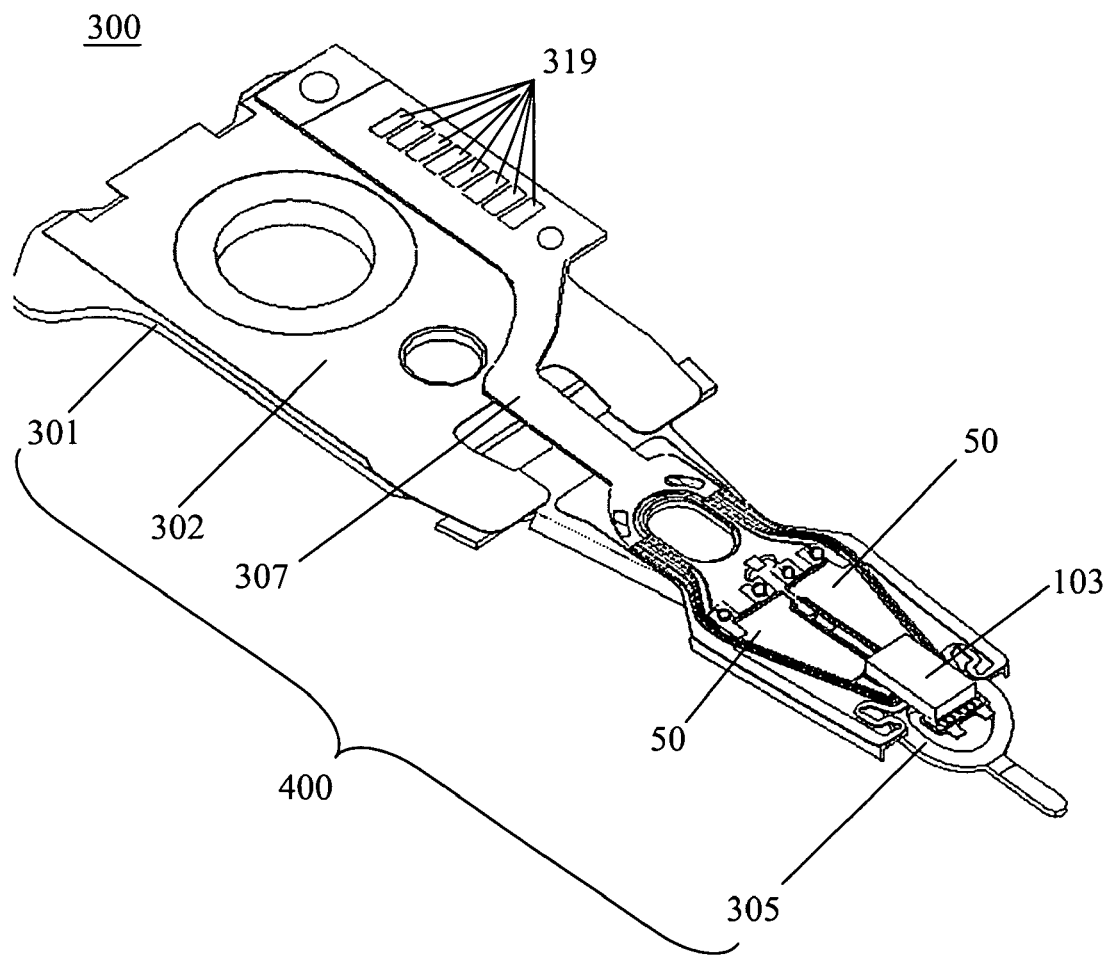
FIG. 12 is a perspective view of a head gimbal assembly of the invention.

Referring to FIG. 12, a head gimbal assembly 300 according to an embodiment of the invention comprises a slider 103, a thin film piezoelectric micro-actuator with two thin film piezoelectric elements 50 (also can be 50a, 50b, 50c or 50d) of the invention, and a suspension 400 supporting the slider 103 and the thin film piezoelectric micro-actuator. The suspension 400 comprises a flexure 307, a load beam 305, a base plate 301 and a hinge 302, which are assembled together. Further referring to FIG. 12a, the flexure 307 has a piezoelectric element mounting region 305a, 305b, a slider mounting region 351, an inner trace 229 and an outer trace 230. The slider mounting region 351 has a plurality of slider connection pads 231 thereon, and the flexure 307 has piezoelectric element connection pads 224, 225, 226, 227 thereon adjacent the piezoelectric mounting region 350a, 350b. One end of the inner trace 229 electrically connects with the piezoelectric element connection pads 224, 227, the other end thereof electrically connects with the electrode pads 319 of the flexure 307, and one end of the outer trace 230 electrically connects with the slider connection pads 231, the other end thereof electrically connects with the electrode pads 319 of the flexure 307. The piezoelectric element connection pads 225, 226 are grounding pads.

Figure 12A:
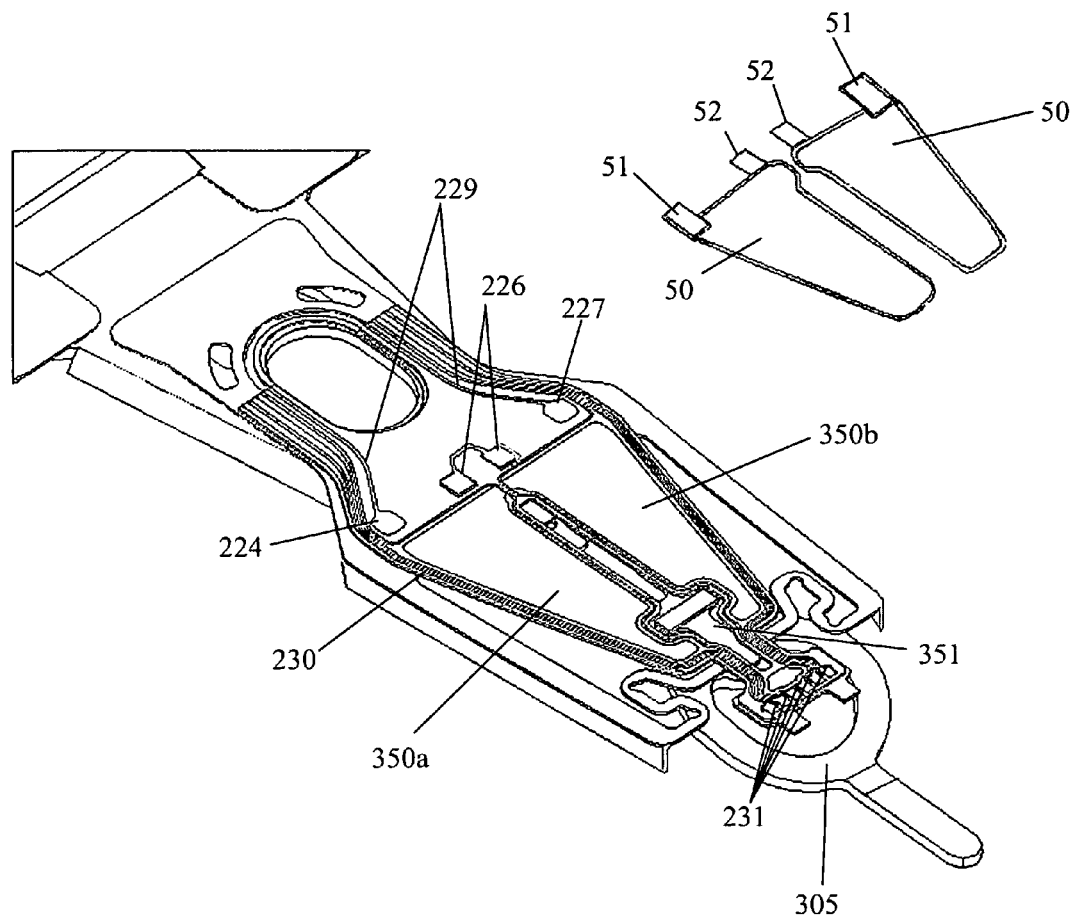
FIG. 12a is a schematic view illustrating a thin film piezoelectric element of the invention preparing to be mounted on a suspension of a head gimbal assembly.
Figure 12B:
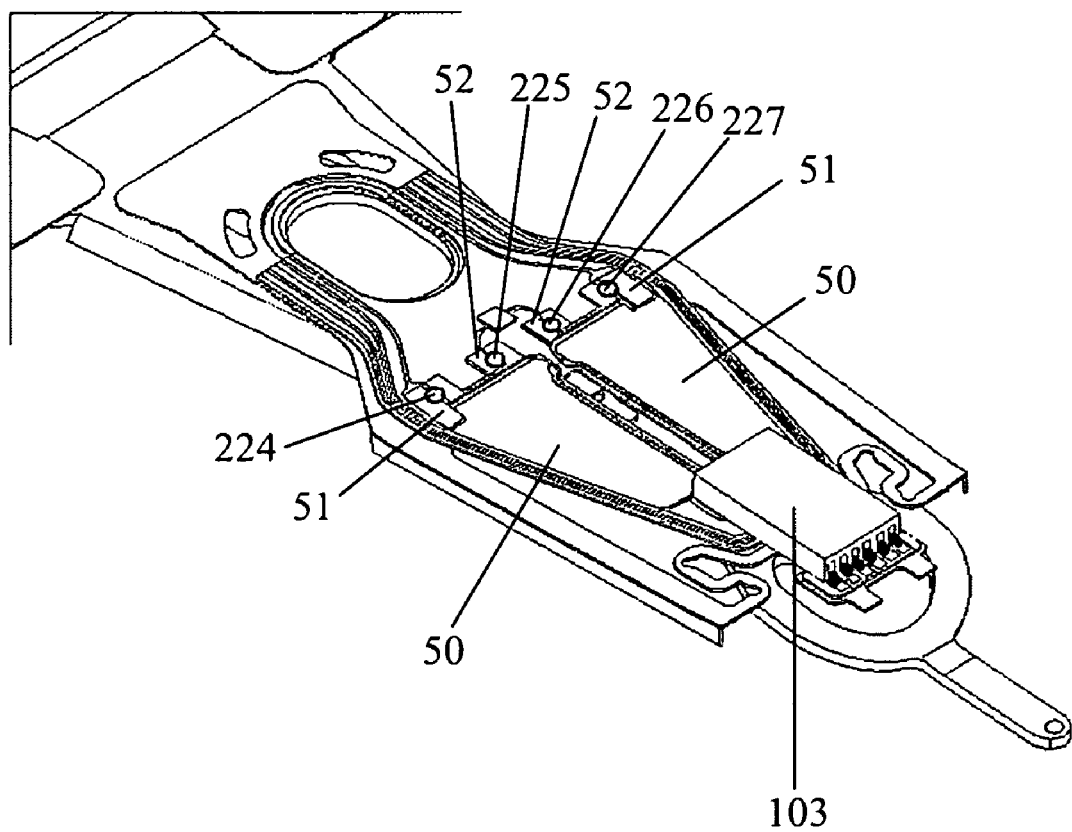
FIG. 12b is a perspective view illustrating a thin film piezoelectric element of the invention had been mounted on a suspension of a head gimbal assembly.

Further referring to FIG. 12a and FIG. 12b, the two thin film piezoelectric elements 50 are mounted onto the flexure 307 of the suspension 400 in the way described bellow: firstly, the two thin film piezoelectric element 50 are mounted on the flexure 307 by respectively clinging their elastic substrate layer to the piezoelectric element mounting region 350a, 350b and adhering them together by adhesive, then electrically connects the electrode pads 51, 52 of one of the thin film piezoelectric elements 50 to the piezoelectric element connection pads 224, 225, and electrically connects the electrode pads 51, 52 of the other thin film piezoelectric element 50 to the piezoelectric element connection pads 227, 226. Such electrical connection can be realized by soldering metal balls between the pads.

Figure 13:
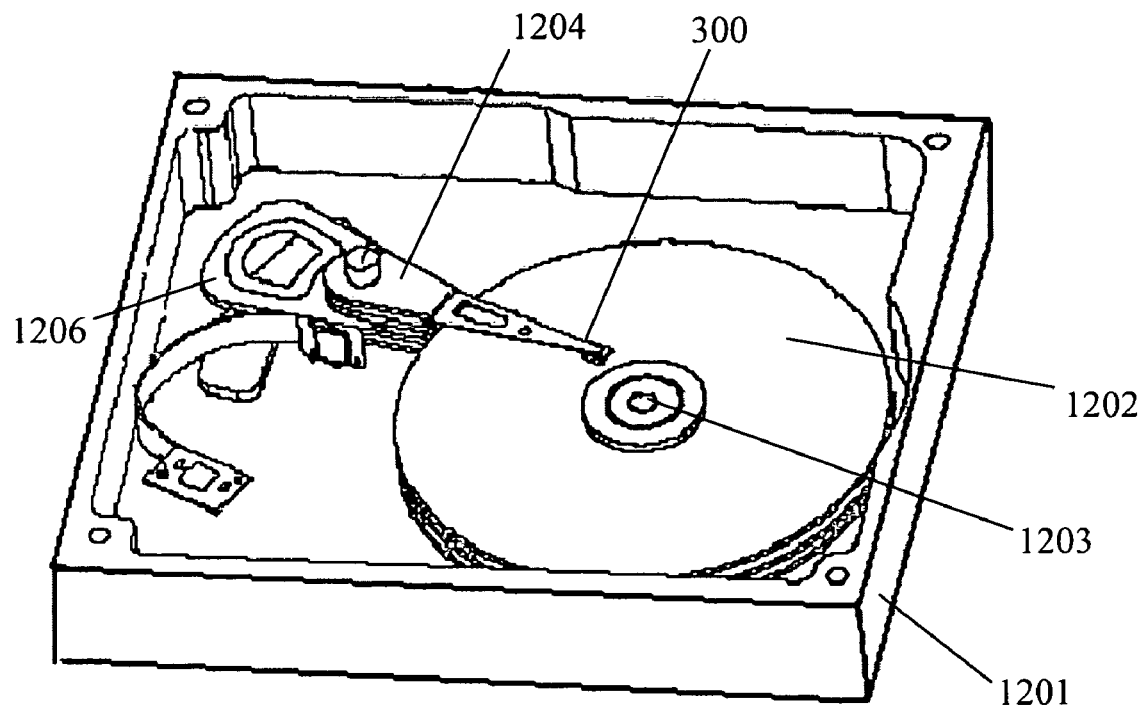
FIG. 13 is a perspective view of a disk drive unit of the invention.

FIG. 13 is a perspective view of a disk drive unit according to an embodiment of the invention. The disk drive unit can be attained by assembling a base 1201, a disk 1202, a spindle motor 1203 for spinning the disk 1202, a VCM 1206, and a drive arm 1204 with the HGA 300. Because the structure and/or assembly process of the disk drive unit of the present invention are well known to persons ordinarily skilled in the art, a detailed description of such structure and assembly is omitted herefrom.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A thin film piezoelectric element, comprising:
   a piezoelectric thin film layer, the piezoelectric thin film layer being a laminated structure comprising a first electrode layer, a second electrode layer and a piezoelectric layer sandwiched between the first electrode layer and the second electrode layer;
   a seed layer formed on the second electrode layer and sandwiched between any two adjacent layers among the first electrode layer, the piezoelectric layer, and the second electrode layer, and/or formed on the first electrode layer; and
   an elastic substrate layer formed on the seed layer.

2. The thin film piezoelectric element according to claim 1, wherein the material of the elastic substrate layer is epoxy material or polymer material.

3. The thin film piezoelectric element according to claim 1, wherein the material of the seed layer is metal or metal oxide.

4. The thin film piezoelectric element according to claim 3, wherein the material of the seed layer is SiO or Ti.

5. The thin film piezoelectric element according to claim 3, wherein the seed layer is 10-200 angstrom in thickness.

6. A method for manufacturing a thin film piezoelectric element comprising:
   (1) forming a piezoelectric thin film layer by laminating a first electrode layer, a piezoelectric layer and a second electrode layer together, wherein the piezoelectric layer is sandwiched between the first electrode layer and the second electrode layer forming a seed layer between any two adjacent layers among the first electrode layer, the piezoelectric layer, and the second electrode layer;
   (2) forming another seed layer on the second electrode layer; and
   (3) forming an elastic substrate layer on the seed layer.

7. The method for manufacturing a thin film piezoelectric element according to claim 6, wherein the material of the elastic substrate layer is epoxy material or polymer material.

8. The method for manufacturing a thin film piezoelectric element according to claim 6, further comprising:
   before (1), forming a seed layer on a wafer substrate, and forming the first electrode layer of a piezoelectric thin film layer on the seed layer formed on the wafer substrate, and
   after (3), removing the wafer substrate by etching.

9. The method for manufacturing a thin film piezoelectric element according to claim 8, wherein the material of the seed layer is metal and metal oxide.

10. The method for manufacturing a thin film piezoelectric element according to claim 9, wherein the material of the seed layer is SiO or Ti.

11. The method for manufacturing a thin film piezoelectric element according to claim 9, wherein the seed layer is 10-200 angstrom in thickness.

12. A head gimbal assembly, comprising:
    a suspension, the suspension comprising a flexure, the flexure having a piezoelectric element mounting region thereon; and
    a thin film piezoelectric element, the thin film piezoelectric element comprising a piezoelectric thin film layer, a seed layer and an elastic substrate layer, the piezoelectric thin film layer being a laminated structure comprising a first electrode layer, a second electrode layer and a piezoelectric layer sandwiched between the first electrode layer and the second electrode layer, the seed layer being formed on the second electrode layer, and sandwiched between any two adjacent layers among the first electrode layer, the piezoelectric layer, and the second electrode layer, and/or being formed on the first electrode layer, the elastic substrate layer being formed on the seed layer, the first and the second electrode layers respectively having a plurality of electrode pads extending outward therefrom, the thin film piezoelectric element being mounted onto the flexure by clinging the elastic substrate layer to the piezoelectric element mounting region and electrically connecting the electrode pads to the flexure.

13. The head gimbal assembly according to claim 12, wherein the material of the elastic substrate layer is epoxy material or polymer material.

14. The head gimbal assembly according to claim 12, wherein the material of the seed layer is metal and metal oxide.

15. The head gimbal assembly according to claim 14, wherein the material of the seed layer is SiO or Ti.

16. The thin film piezoelectric element according to claim 12, wherein the seed layer is 10-200 angstrom in thickness.

17. A disk drive unit, comprising:
    a disk;
    a spindle motor to spin the disk;
    a drive arm; and
    a head gimbal assembly mounted on the drive arm, the head gimbal assembly comprising:
    a suspension, the suspension comprising a flexure, the flexure having a piezoelectric element mounting region thereon; and
    a thin film piezoelectric element, the thin film piezoelectric element comprising a piezoelectric thin film layer, a seed layer and an elastic substrate layer, the piezoelectric thin film layer being a laminated structure comprising a first electrode layer, a second electrode layer and a piezoelectric layer sandwiched between the first electrode layer and the second electrode layer, the seed layer being formed on the second electrode layer, and sandwiched between any two adjacent layers among the first electrode layer, the piezoelectric layer, and the second electrode layer, and/or formed on the first electrode layer, the elastic substrate layer being formed on the seed layer, the first and the second electrode layers respectively having a plurality of electrode pads extending outward therefrom, the thin film piezoelectric element being mounted onto the flexure by clinging the elastic substrate layer to the piezoelectric element mounting region and electrically connecting the electrode pads to the flexure.

18. The method for manufacturing a thin film piezoelectric element according to claim 6, wherein the material of the seed layer is metal and metal oxide.

* * * * *